United States Patent
Wall et al.

(10) Patent No.: US 7,567,024 B2
(45) Date of Patent: Jul. 28, 2009

(54) METHODS OF CONTACTING THE TOP LAYER OF A BAW RESONATOR

(75) Inventors: Ralph N. Wall, Beaverton, OR (US); Guillaume Bouche, Beaverton, OR (US); Edward Martin Godshalk, Newberg, OR (US); Rick D. Lutz, Portland, OR (US); Garth Sundberg, Portland, OR (US)

(73) Assignee: Maxim Integrated Products, Inc., Sunnyvale, CA (US)

(*) Notice: Subject to any disclaimer, the term of this patent is extended or adjusted under 35 U.S.C. 154(b) by 0 days.

(21) Appl. No.: 11/862,020

(22) Filed: Sep. 26, 2007

(65) Prior Publication Data

US 2009/0079302 A1    Mar. 26, 2009

(51) Int. Cl.
    *H01L 41/08*    (2006.01)
(52) U.S. Cl. .................... 310/365; 310/320
(58) Field of Classification Search ............ 310/365, 310/366, 312
    See application file for complete search history.

(56) References Cited

U.S. PATENT DOCUMENTS

| 5,373,268 | A | 12/1994 | Dworsky et al. | |
| 6,577,043 | B2 * | 6/2003 | Tsukai et al. | 310/320 |
| 2002/0030420 | A1 | 3/2002 | Tsukai et al. | |

FOREIGN PATENT DOCUMENTS

EP    0771070    5/1997

OTHER PUBLICATIONS

W. E. Newell, "Face-Mounted Piezoelectric Resonators", Proceedings of the IEEE, 1965, pp. 575-581.
K.M. Lakin et al., "Stacked Crystal Filters Implemented with Thin Films", 43rd Annual Symposium on Frequency Control, 1989, pp. 536-543.
R. Aigner et al. "Advancement of MEMS into RF-Filter Applications", Proceedings of IEDM, 2002, pp. 897-900.
J. Kaitila et al., "Spurious Resonance Free Bulk Acoustic Wave Resonators", IEEE Ultrasonics Symposium, 2003, pp. 84-87.
Jae Y. Park et al., "Micromachined FBAR RF Filters for Advanced Handset Applications", 12th International Conference on Solid State Sensors, Actuators and Microsystems, 2003, pp. 911-914.

(Continued)

*Primary Examiner*—Mark Budd
(74) *Attorney, Agent, or Firm*—Blakely Sokoloff Taylor & Zafman LLP

(57) ABSTRACT

Methods of contacting the top layer in a BAW device by depositing a metal layer over the BAW device, patterning the metal layer so that the metal layer extends over and contacts the top electrode layer of the BAW device only at a plurality of spaced apart locations adjacent the periphery of the active resonator area, and has a common region laterally displaced from the top and bottom electrodes and electrically interconnecting the parts of the metal layer extending over and contacting the top electrode of the BAW device at the plurality of spaced apart locations.

3 Claims, 1 Drawing Sheet

OTHER PUBLICATIONS

G. G. Fattinger et al., "Optimization of Acoustic Dispersion for High Performance Thin Film BAW Resonators", IEEE Ultrasonics Symposium, 2005, pp. 1175-1178.

Tuomas Pensala et al., "Spurious resonance suppression in ZnO based thin-film BAW resonators: FEM modeling and experiment", IEEE Ultrasonics Symposium, 2005, pp. 1844-1847.

Edgar Schmidhammer et al., "High Volume Production of a fully matched 5050 PCS-CDMA-BAW Duplexer", IEEE Ultrasonics Symposium, 2006, pp. 329-332.

"International Search Report and Written Opinion of the International Searching Authority Dated Sep. 8, 2008", International Application No. PCT/US2008/005628.

* cited by examiner

METHODS OF CONTACTING THE TOP LAYER OF A BAW RESONATOR

BACKGROUND OF THE INVENTION

1. Field of the Invention

The present invention relates to the field of piezoelectric resonators whose primary application is for signal filtering and reference oscillators.

2. Prior Art

The present invention pertains to piezoelectric resonators whose primary application is for signal filtering and reference oscillators. These resonators are commonly referred to as BAW (bulk acoustic wave resonators). Other acronyms for the same or similar devices include FBAR (film bulk acoustic resonators) or SMR (solidly mounted resonators), or TFR (thin film resonators) or SCF (stacked crystal filters).

The resonators must be as efficient as possible in terms of energy losses. These devices are not new and are well documented in the literature.

Standard IC fabrication methods are used for the basic manufacturing sequences, including depositions, photolithography, and etch processes. MEMS techniques may also be employed for packaging and resonator acoustic isolation from the substrate.

A Bragg mirror is used for acoustic isolation in SMR devices. In FBAR devices, the resonators are built upon a membrane. Both types of isolation are designed to prevent energy loss in the device.

Key aspects of a bulk acoustic wave resonator (BAW) are the quality factors (Q). The Q values are dominated by electrical and acoustical losses. Connections to the resonator need to minimize electrical resistance and also avoid interference with the acoustic balance of the device.

One method of contacting the top electrode is to use the top electrode metal itself for routing to a position well outside of the device, as shown in FIG. 1. This is the common practice. It has several disadvantages:

1. The top electrode sheet resistance is typically about 10 times higher than an average low resistance metal interconnect layer.
2. The top electrode defines the device area. By allowing the active device area as defined by the top electrode to extend beyond the bottom electrode edge there are potential additional parasitic acoustic modes excited.
3. At the bottom electrode edge there are usually defects and poor crystal orientation of the piezoelectric material that can interfere acoustically. It is preferable to not cross these boundaries with the top electrode active area.

If the resonator architecture includes non-planarized topography (e.g. from the patterned Bragg reflector layers) then the deposition and pattering of the thin top electrode layer over the topography can result in higher resistance.

DETAILED DESCRIPTION OF THE PREFERRED EMBODIMENTS

The present invention pertains to how to make electrical contact to a resonator with minimal added losses or other impact on the resonator characteristics. In particular, electrical connection must be made to the top electrode of the resonator. Any physical contact to the top electrode will have associated acoustic losses (e.g. losses from parasitic or spurious resonances caused by non-uniform loading). The problem is how to contact the top electrode of a resonator with minimum electrical resistance, minimal acoustic loading at the top electrode edge, and maximize conduction spread (i.e. signal feed). Acoustic problems arise from non-symmetry of the resonator at the electrical contact area, from piezoelectric defects and poor crystal alignment at or near the bottom electrode edge, and from excessive loading or non-uniform perimeter loading. Extrinsic conduction problems arise from high resistance interconnect materials and from excessive width of the interconnect feed. In the present invention, metal fingers are used to contact the top electrode of a BAW device to minimize electrical resistance and to minimize the acoustic load impact of the contact area.

People trained in BAW technology widely recognize that uniquely tailored resonator loading at the resonator perimeter can reduce spurious modes. This method of spurious mode reduction has been referred to as framing. It consists of tailoring the acoustic boundary condition at the periphery of the resonator to avoid generating energy consuming modes. Optimized perimeter loading and an optimized active resonator stack will result in a piston-type main mode within the resonator. The electrical contact to the top electrode should interfere as little as possible with the perimeter loading of the resonator. Again, metal fingers have been found to represent a good compromise of all competing requirements.

Figure 1:
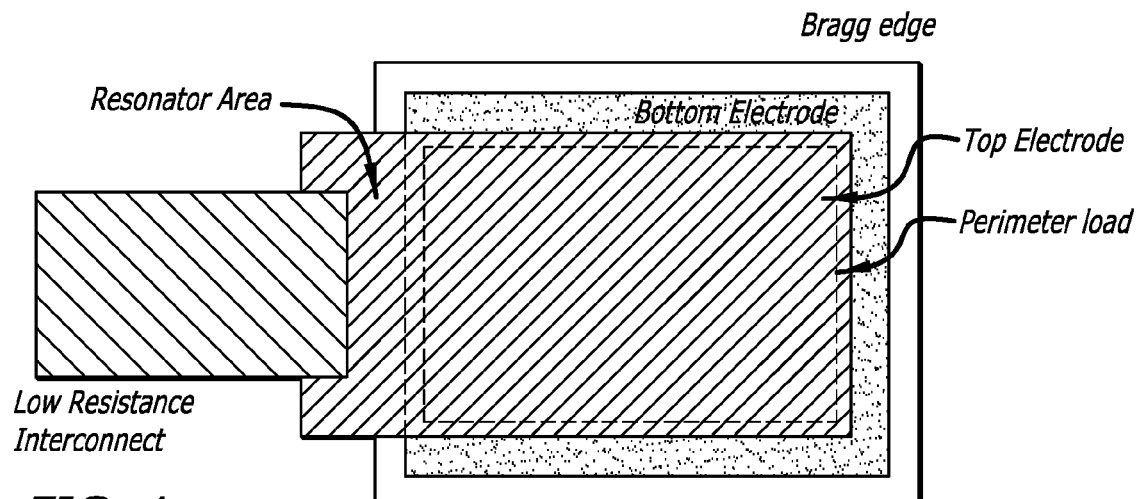
FIG. 1 illustrates a prior art method of contacting the top electrode of a BAW using the top electrode metal itself.
Figure 2:
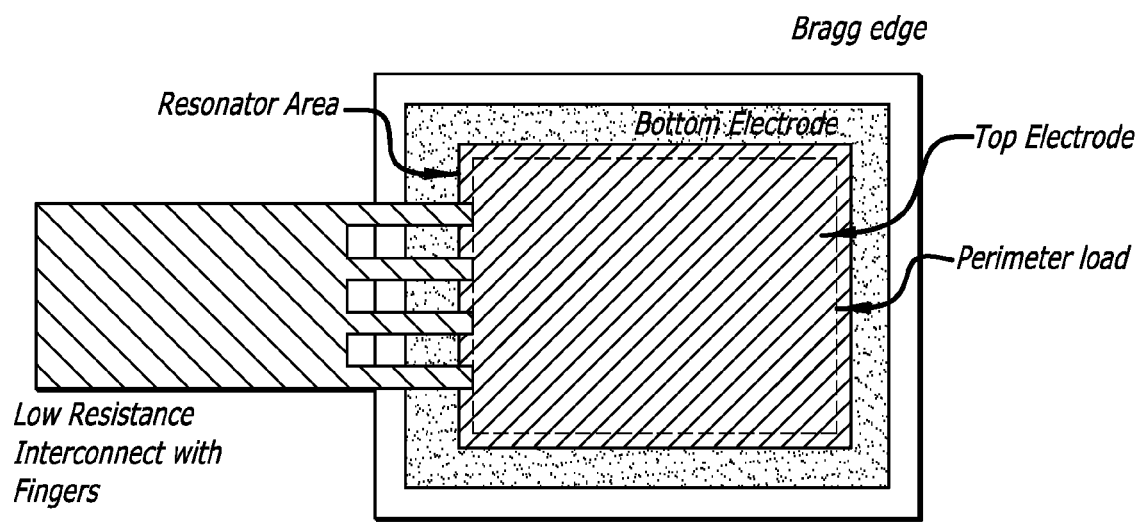
FIG. 2 illustrates a BAW resonator contacted on the top electrode edge by a low resistance metal conductor through a series of fingers in accordance with the present invention.

In the present invention, a BAW resonator is contacted on the top electrode edge by a low resistance metal conductor through a series of fingers, as schematically shown in FIG. 2. In such a configuration, there may be many alternatives, some of which are listed below.

1. The low resistance metal can be gold or copper or aluminum or a similar metal or alloy.
2. The metal may be deposited and patterned in a variety of methods (e.g. plate-up, PVD, CVD, CMP/damascene, etc.).
3. The finger width and spacing can be optimized for the specific resonator size and application.
4. The number of fingers is dependent on the size of the resonator and optimized finger spacing.
5. Fingers can be applied to one or more than one top electrode edge.
6. The fingers would normally terminate in the perimeter loaded region of the device to avoid interaction with the main acoustic resonator area.
7. The fingers may or may not extend across the Bragg edge.
8. The fingers may or may not extend across the bottom electrode.
9. The top electrode can be constructed of any material or materials suitable for its purpose.
10. The bottom electrode may or may not extend beyond the edge of the top electrode.
11. The piezoelectric may be any piezoelectric material (e.g. AlN or ZnO).
12. The fingers may contact directly to the top electrode or they may contact through a via (e.g. in the case the device has a top dielectric layer, or top loading layer, or passivation layer, or protection layer of any kind).
13. The bottom electrode may or may not be planarized.
14. The Bragg layers may or may not be planarized.
15. The device may be SMR or FBAR.
16. The resonator shape is not restricted. It can be any shape.

17. The fingers may be of any shape, and are not limited to a rectangular shape. By way of example, they may be "T" shaped, the shank of the T providing a local, low resistance path, and the top of the T providing contact distribution to the lower conductivity resonator. Whatever the shape, the fingers contact the edges of the top electrode layer at a plurality of spaced apart locations, and are interconnected by a common region displaced from the active resonator area.

There are several benefits from this invention, some of which are listed below:

1. A very low resistance interconnect is achieved that brings the signal right to the electrode edge.

2. The low resistance path is distributed over a wider region of the device while maintaining a low total contact area (i.e. by using a manifold as shown—in FIG. 2).

3. Edge discontinuities associated with crossing the bottom electrode with the top electrode are eliminated.

4. Local thinning of the top electrode is completely avoided as compared to when the top electrode is used as the interconnect which crosses topography (e.g. bottom electrode and/or Bragg edge).

5. Piezoelectric imperfections which exist at or near the bottom electrode edge are maintained far from the active resonator area on all sides of the resonator.

6. Perimeter loading can be applied symmetrically on all edges of the resonator (i.e. with minimal impact from the interconnect loading).

BAW resonators are the building blocks of various signal filtering devices. The resonators must be electrically connected together to form filters. The performance of the filter is directly impacted by resistance losses associated with this extrinsic interconnection of resonators. Thus, the invention is applicable to all BAW filter construction. These filters can be designed to operate at a wide range of frequencies to address virtually all market filter applications (e.g. GSM, GPS, UMTS, PCS, WLAN, WIMAX, etc.).

While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A BAW device comprising:
a bottom electrode;
a piezoelectric layer disposed over the bottom electrode;
a top electrode over the piezoelectric layer; and,
a metal contact layer extending over and contacting a the top electrode of the BAW device only at a plurality of spaced apart locations adjacent the periphery of the active area, and having a common region laterally displaced from the active resonator area.

2. The BAW device of claim 1 wherein the metal layer contacts the top electrode of the BAW device at each of a plurality of fingers integral with the common region of the metal layer.

3. A BAW device comprising:
a bottom electrode;
a piezoelectric layer over the bottom electrode;
a top electrode, the top electrode being exposed at least a plurality of spaced apart locations adjacent the periphery of the piezoelectric layer;
a metal layer over the top electrode patterned so that the metal layer has a plurality of fingers, each extending over the periphery of the bottom electrode and contacting the top electrode at a respective one of the spaced apart locations at which the top electrode was exposed, the patterned metal layer having a common region laterally displaced from the piezoelectric layer and electrically interconnecting the fingers.

* * * * *